United States Patent
Leussler

(10) Patent No.: US 8,659,296 B2
(45) Date of Patent: Feb. 25, 2014

(54) DOUBLE LAYER MULTI ELEMENT RF STRIP COIL ARRAY FOR SAR REDUCED HIGH FIELD MR

(75) Inventor: Christoph Leussler, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 487 days.

(21) Appl. No.: 12/936,423

(22) PCT Filed: Apr. 2, 2009

(86) PCT No.: PCT/IB2009/051393
§ 371 (c)(1),
(2), (4) Date: Oct. 5, 2010

(87) PCT Pub. No.: WO2009/125320
PCT Pub. Date: Oct. 15, 2009

(65) Prior Publication Data
US 2011/0043208 A1    Feb. 24, 2011

(30) Foreign Application Priority Data
Apr. 9, 2008    (EP) .................... 08103449

(51) Int. Cl.
*G01V 3/00*    (2006.01)
(52) U.S. Cl.
USPC .......................................... 324/318; 324/322
(58) Field of Classification Search
USPC ......................... 324/318, 322, 300, 307, 309
See application file for complete search history.

(56) References Cited

U.S. PATENT DOCUMENTS

| | | | |
|---|---|---|---|
| 6,150,816 A | 11/2000 | Srinivasan | |
| 6,798,204 B2 | 9/2004 | Seeber et al. | |
| 7,023,209 B2 * | 4/2006 | Zhang et al. | 324/318 |
| 7,560,927 B2 * | 7/2009 | Maguire et al. | 324/318 |
| 7,579,835 B2 * | 8/2009 | Schnell et al. | 324/318 |
| 7,816,918 B2 * | 10/2010 | Bottomley et al. | 324/318 |
| 7,876,101 B2 * | 1/2011 | Lee | 324/322 |
| 8,004,281 B2 * | 8/2011 | Bottomley et al. | 324/318 |
| 2005/0264291 A1 | 12/2005 | Vaughan et al. | |
| 2006/0061360 A1 | 3/2006 | Leussler et al. | |
| 2006/0250125 A1 | 11/2006 | Bogdanov et al. | |
| 2009/0206840 A1 | 8/2009 | Overweg | |

FOREIGN PATENT DOCUMENTS

| | | |
|---|---|---|
| DE | 4331021 A1 | 3/1995 |
| EP | 1059539 A2 | 12/2000 |
| WO | 2005111646 A1 | 11/2005 |
| WO | 2006090293 A2 | 8/2006 |

OTHER PUBLICATIONS

Wiggins et al: "Eight-Channel Phased Array Coil and Detunable TEM Volume Coil for 7 T Brain Imaging"; Magnetic Resonance in Medicine, 2005, vol. 54, pp. 235-240.

(Continued)

*Primary Examiner* — Louis Arana

(57) ABSTRACT

A high or ultra-high field magnetic resonance imaging method and device including a double-layered transmit-receive coil array that includes a transmit element placed in close proximity to a radio frequency shield to reduce SAR, and a receive element that is placed further away from the shield to improve SNR. The transit and receive elements may be mutually decoupled using diodes, transformers, or other decoupling techniques. A portion of the transmit element may pass in front of the RF shield while capacitors in the transmit element may be positioned behind the shield.

18 Claims, 9 Drawing Sheets

(56) References Cited

OTHER PUBLICATIONS

Kurpad et al: "RF Current Element Design for Independent Control of Current Amplitude and Phase in Transmit Phased Arrays"; Concepts in Magnetic Resonance, NMR Concepts, 2006, vol. 29B, pp. 75-83.

Vernickel et al: "An Eight Channel Transmit/Receive Body Coil for 3T"; Proc. International Society for Magnetic Resonance in Medicine, 2006, vol. 14, p. 123.

* cited by examiner

DOUBLE LAYER MULTI ELEMENT RF STRIP COIL ARRAY FOR SAR REDUCED HIGH FIELD MR

FIELD OF THE INVENTION

The present application finds particular application in patient imaging systems, particularly involving patient imaging devices such as high field magnetic resonance imaging (MRI) devices. However, it will be appreciated that the described technique may also find application in spectroscopy systems, other radio frequency (RF) transmission and reception scenarios, other imaging techniques, and the like.

BACKGROUND OF THE INVENTION

A large in-bore transmit body coil and a separate receive coil array has been used for clinical whole body MR scanners. At high and ultra-high field (e.g., greater that 3T strengths), this concept is not well-suited for cardiac and abdominal imaging.

Radio frequency (RF) radiation effects are increasing with frequency and inner bore diameter, which makes the application of standard RF body coils less favorable for high and ultra-high field MR whole body imaging. The $B_1$ homogeneity inside the object no longer depends on the geometry of the coil, but rather is dominated by dielectric resonance and RF eddy current effects. These inhomogeneous effects can be altered and externally modulated by individual current and phase distribution or the application of 3D transmit pulses using transmit sensitivity encoding (SENSE) or other parallel imaging techniques, but such methods are limited by the high specific energy absorption rate (SAR) when using bore-integrated large body coil arrays. The SAR problem can be reduced when focusing on dedicated applications (head, cardiac, abdomen, etc.) using local transmit/receive (T/R) arrays.

Local T/R arrays are more optimal for transmit SENSE applications, as the matrix inversion is better conditioned. Conventional surface coils arrays with single individual coil elements cannot be optimized at the same time for low SAR and high SNR. The present application provides new and improved coil array construction systems and methods, which overcome the above-referenced problems and others.

SUMMARY OF THE INVENTION

In accordance with one aspect, a double-layer transmit and receive (T/R) coil array for a high field magnetic resonance imaging (MRI) system includes a radio frequency (RF) shield, a transmit coil strip, positioned adjacent the shield at a first distance from the shield, and a receive coil strip that receives MR data, positioned behind the transmit coil strip at a second distance from the shield, the second distance being greater than the first distance.

In accordance with another aspect, a method for concurrently reducing specific energy absorption rate (SAR) and increasing signal-to-noise ratio (SNR) for transmit and receive elements in a T/R coil array in a high-field magnetic resonance imaging (MRI) system includes positioning a transmit coil strip at a first distance from a radio frequency (RF) shield, positioning a receive coil strip at a second distance from the RF shield, the second distance being greater than the first distance, and transmitting RF pulses with the transmit coil strip and receiving magnetic resonance signals with the receive coil strip.

One advantage is that SAR levels are reduced during transmission of RF signals.

Another advantage resides in increased SNR during reception of MR signals.

Another advantage is that TEM transmit parallel imaging for high and ultra high field imaging is improved.

Another advantage resides in increased patient space for large patients.

Another advantage resides in facilitating ultra-short transmit pulse duration.

Still further advantages of the subject innovation will be appreciated by those of ordinary skill in the art upon reading and understand the following detailed description.

BRIEF DESCRIPTION OF THE DRAWINGS

The innovation may take form in various components and arrangements of components, and in various steps and arrangements of steps. The drawings are only for purposes of illustrating various aspects and are not to be construed as limiting the invention.

FIG. 5 illustrates a flat coil package arrangement of the coil array, which may be formed on a printed circuit board or the like.

DETAILED DESCRIPTION OF EMBODIMENTS

Figure 1:
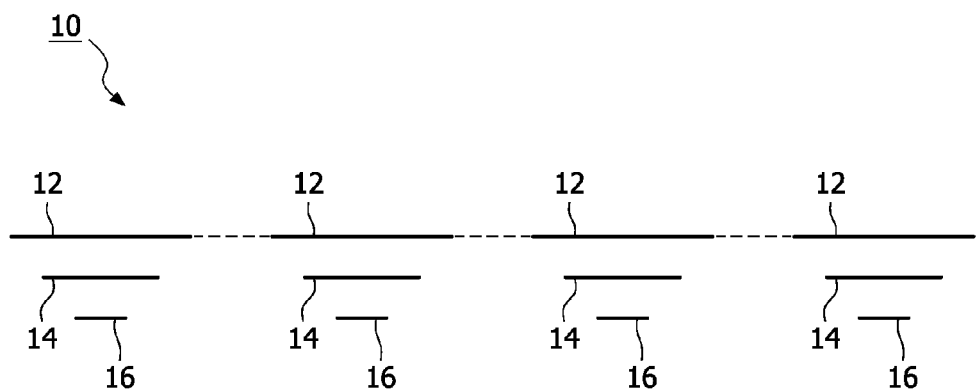
FIG. 1 illustrates a transmit-and-receive (T/R) coil array comprising a plurality of RF shield segments, each with a transmit strip coil disposed near the RF shield and a receive strip coil disposed further away from the RF shield.

FIG. 1 illustrates a transmit and receive (T/R) coil array 10 for optimization comprising a plurality of RF shields 12 or shield segments, each with a transmit coil strip 14 disposed near the RF shield and a receive coil strip 16 disposed further away from the RF shield. The strips 14, 16 can be viewed as strings of capacitive couplings. The T/R coil array (e.g., including transmit strip 14 and receive strip 16) is optimized to achieve low SAR and high SNR using the double layer concept with two separate conductors. The local shield 12 is close to the transmit-only conductor strip 14 and more remote to the receive-only strip 16 and are differently optimized. The transmit strip is optimized for low local SAR and supports high RF currents due to the close proximity of the RF shield. The receive conductor strip is optimized for high SNR and its components are low-power devices. In one embodiment, the shield acts as a return path for current running through the transmit and receive strips. The multi-layer construction can be mechanically mounted inside a matrix, which can have permittivity greater than 1, e.g. Teflon.

For high (e.g., greater than 3T) and ultra-high field (e.g., 7T) whole body MR imaging, the double layered T/R coil array uses the effect of a lower ratio of electrical versus magnetic field for the transmit conductor or conductor strip, when approaching the RF shield, permitting optimization for a lowest SAR value. The receive conductor or conductor strip is more distant to the RF shield and is optimized for high RF power sensitivity to obtain optimal SNR. The double layered coil arrays can replace large in-bore transmit body coils for high and ultra high field MR applications and thus provide more in-bore space for the patient. Improved distinct transmit SENSE sensitivity patterns are generated compared to large body coils. A transverse electromagnetic (TEM) parallel imaging transmit and receive coil array is thus realized, which covers the total patient body. SAR and SNR are separately optimized by numerical electromagnetic calculation.

There are several advantages associated with the coil array 10 described herein. For instance, the use of a smaller inner bore diameter results in less RF propagation and radiation effects. The use of ultra short $B_0$ magnets mitigates radiation problems. The surface coil transmit array has considerably reduced local SAR. Additionally, RF safety is improved at high field strength. Inductive coupling between transmit elements is reduced due to the closeness to the RF shield. Inductive coupling to the receive-only coil is also mitigated or eliminated. A bore-integrated body coil is not required, creating more patient space. Furthermore, better conditioning of the matrix improves circumstances for transmit parallel imaging, e.g. SENSE, at high field strength. Since coil interaction is reduced or eliminated, as are cable current problems, RF safety for high and ultra high field MRI is improved. Still furthermore, RF radiation losses are reduced and there is reduced coupling to an interventional catheter (not shown) employed with the coil array 10.

In accordance with one or more aspects described herein, the receive coil is turned off or detuned when the transmit coil is transmitting, and the transmit coil is turned off or detuned when the receive coil is receiving. According to one embodiment, the receive coil is approximately twice as far from the shield as the transmit coil. For example, if the transmit coil is 1 cm from the shield, then the receive coil is positioned 2 cm from the shield.

Additionally, the various embodiments described herein can be used in high field cardiac and body MRI systems, interventional MRI systems, and the like, and facilitate increasing imaging space for large patients. Moreover, a cooling system (e.g., air, liquid, etc.) can be employed with the coil array 10 to cool components thereof and/or a patient being imaged using the coil array.

According to an example, the coil array 10 or a plurality thereof are positioned over a patient and employed to track catheter movement through the patient. Transmit coils near the leading edge of the catheter are permitted to transmit, while transmit coils away from the leading edge of the catheter can be prevented from transmitting to mitigate excitation of the catheter tip to improve patient comfort.

According to another example, a processor (not shown) executes computer-readable instructions stored in a memory (not shown) for controlling a magnetic resonance scanner in which the receive and transmit strips are employed. For instance, the processor can control transmit and receive intervals for one or more strips. In another embodiment, the processor controls transmit and receive functions for a plurality of receive and transmit strips to track movement of a catheter through a patient.

Figure 2:
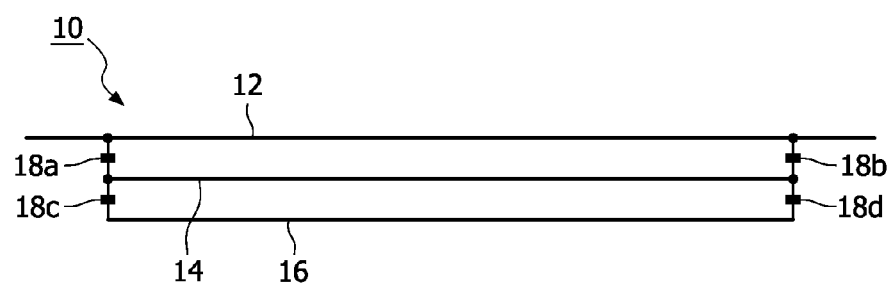
FIG. 2 illustrates an embodiment of the coil array in which the shield, transmit strip, and receive strip are coupled by capacitors that ensure homogeneous current through the conductor strips and provide resonance.

FIG. 2 illustrates an embodiment of the coil array 10 in which the shield 12, transmit strip 14, and receive strip 16 are coupled by capacitors 18a, 18b, 18c, 18d that ensure homogeneous current through the conductor strips and provide resonance. For example, capacitors 18a and 18b couple the transmit strip to the shield, while capacitors 18c and 18d couple the receive strip to the transmit strip. Optionally, the strips 14, 16 are strip lines that include a multiplicity of capacitors.

Figure 3A:
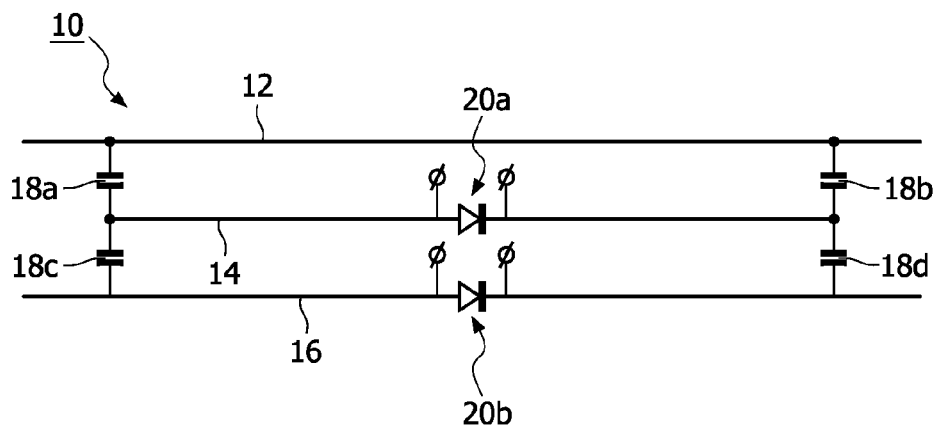
FIGS. 3A and 3B illustrate embodiments in which RF currents between the transmit and receive strips are decoupled using PIN diodes, in accordance with various aspects described herein.
Figure 3B:
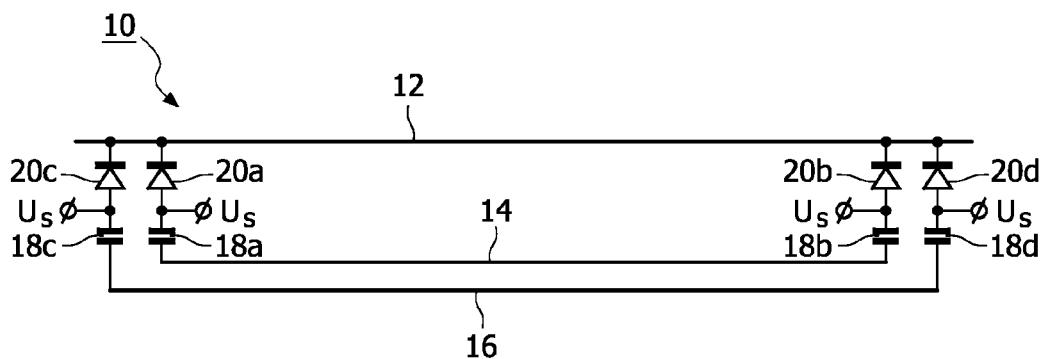

FIGS. 3A and 3B illustrate embodiments in which RF currents between the transmit and receive strips are decoupled using PIN diodes, in accordance with various aspects described herein. In FIG. 3A, the shield 12, the transmit strip 14, and the receive strip 16 are coupled by capacitors 18a-18d, which provide resonance and ensure homogeneous current through the conductor strips. The transmit strip 14 includes a pin diode 20a, and the receive strip 16 includes a pin diode 20b, such that both conductors are switched to be conductive or non-conductive by the bias on the pin diodes for selective detuning.

In FIG. 3B, the transmit strip 14 and the receive strip 16 are separately coupled to the shield 12. The transmit strip is coupled to the shield at each end by a capacitor 18a and an electronic switch 20a, and capacitor 18b and electronic switch 20b, respectively.

Similarly, the receive strip 16 is coupled to the shield by capacitors 18c and 18d, and electronic switches 20c and 20d. In one embodiment, the electronic switches are pin diodes. In this manner, decoupling of the RF currents between the receive strip and the transmit strip is controlled.

Figure 4:
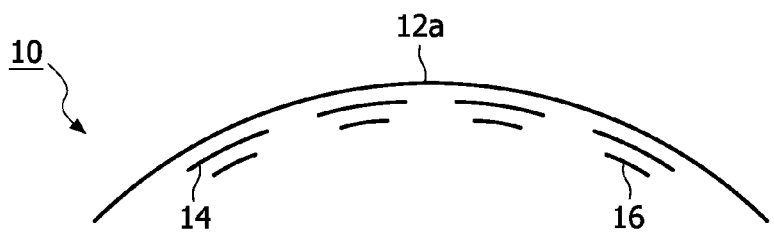
FIG. 4 illustrates another embodiment of the coil array including a flexible transmit/receive coil array with a single large shield and individual transmit strips and receive strips.

FIG. 4 illustrates another embodiment of the coil array 10 including a flexible transmit/receive coil array with a single, flexible large shield 12a and individual transmit strips 14 and receive strips 16. As an alternative to other embodiments, the single large shield is shared by a plurality of T/R strip coils. The screen can be designed to have a specific or desired thickness (e.g., approximately 100 micrometers to approximately 1 millimeter, etc.).

Figure 5:
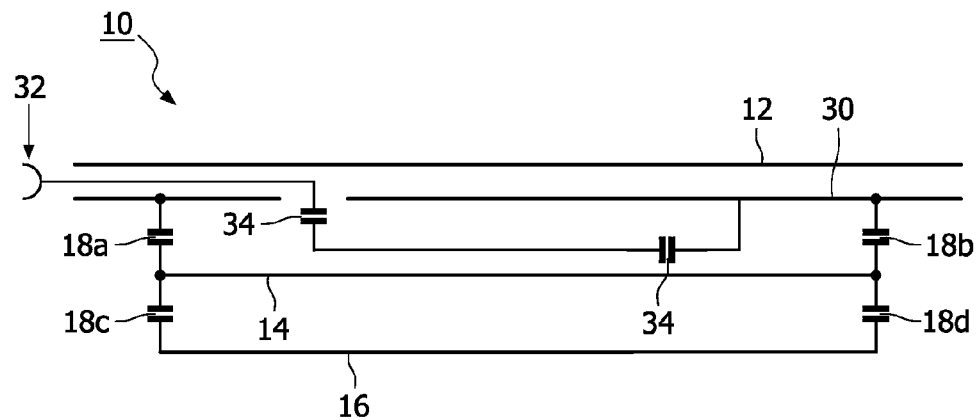

FIG. 5 illustrates a flat coil package arrangement of the coil array 10, which may be formed on a printed circuit board or the like. The array includes the RF shield 12, as well as a second RF shield 30 to which the transmit strip 14 and the receive strip 16 are coupled by capacitors 18a-18d. Although the particular coupling arrangement shown in FIG. 5 is similar to that of FIG. 2, it will be appreciated that any of the coupling arrangements described herein may be employed in conjunction with the dual shield embodiment of FIG. 5. The array 10 additionally includes an input line 32 (e.g., an RF feed strip line or the like) with capacitors 34. While the shield 12 insulates the input line 32, the second shield 30 prevents cable waves in the input line. Additionally, inductive coupling of the transmit coil strip and/or the receive coil strip prevents cable waves (e.g., in the feed strip line 32 behind shield 30) and permits the coil array to be arranged in a flat package.

Figure 6:
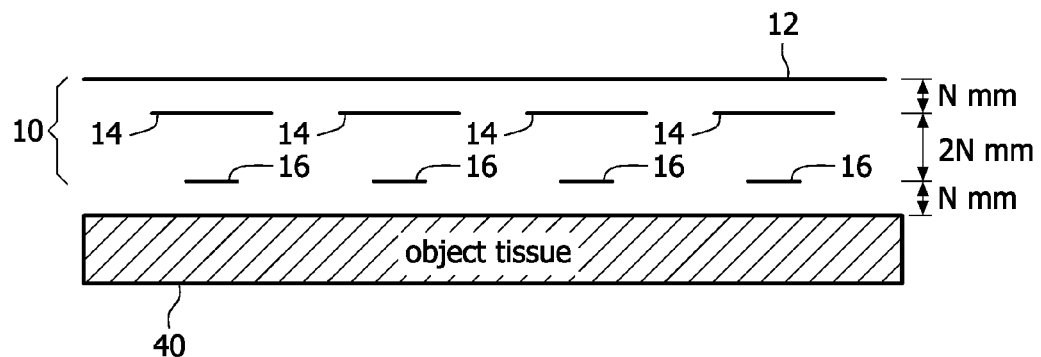
FIG. 6 is an illustration of geometric parameters that can be employed in the double layer coil array.

FIG. 6 is an illustration of geometric parameters that can be employed in the double layer coil array 10. In one embodiment, the shield 12 is spaced from the transmit strip(s) 14 by a distance of N, which in turn is spaced from the receive strip(s) 16 by a distance of 2N. The receive strip(s) are displaced from object tissue 40 (e.g., a patient or the like) by a distance of N. In one example, N is approximately 5 mm, although it will be appreciated that other values of N may be employed in conjunction with various design parameters and preferences.

According to another embodiment, the distance N is varied along the length of the shield 12, and magnetic field strength gradients caused by the varied distance are employed to reduce homogeneity. For example, RF power delivered to RF sensitive tissue e.g., the eyes, can be selectively reduced.

Figure 7:
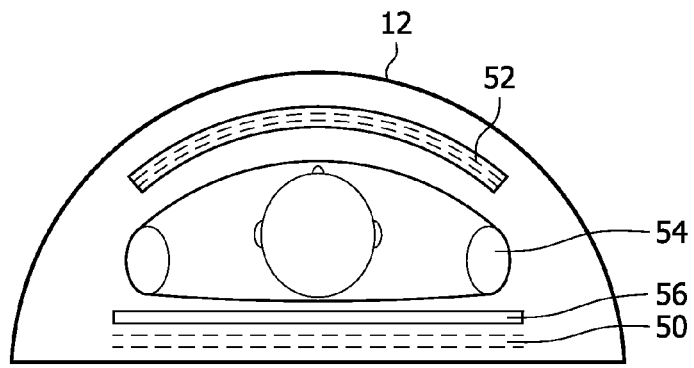
FIG. 7 illustrates a double layer T/R coil array (posterior) and a flexible T/R coil array (anterior) surrounding a patient on a patient support.

FIG. 7 illustrates a double layer T/R coil array 50 (posterior) and a flexible T/R coil array 52 (anterior) surrounding a patient 54 on a patient support 56. A shield 12 surrounds the patient and the coils. In one embodiment, the array 50 is similar or identical to the array 10 described in various embodiments herein. The array 52 may likewise be similar or identical to the flexible array of FIG. 4. The arrangement shown in FIG. 7 can be employed in an asymmetrical bore or the like, and facilitates placing the coil arrays in close proximity to the patient. In one embodiment, the coil array 50 is integral to the patient support.

Figure 8:
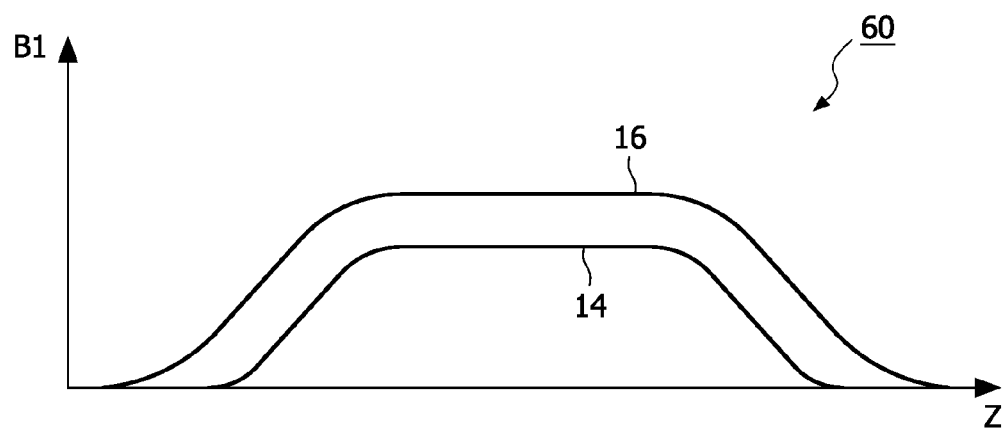
FIG. 8 illustrates a graph of magnetic field strength along a z-axis that runs longitudinally through the patient (e.g., from head to toe).

FIG. 8 illustrates a graph 60 of $B_1$ field strength along a z-axis that runs longitudinally through the patient (e.g., from head to toe). The $B_1$ field associated with the receive strip coil 16 is stronger and extends along a larger portion of the patient that a $B_1$ field for the transmit strip coil 14. $B_1$ field strength correlates to coil sensitivity, and thus the transmit strip has a lower sensitivity relative to the receive coil strip.

Figure 9:
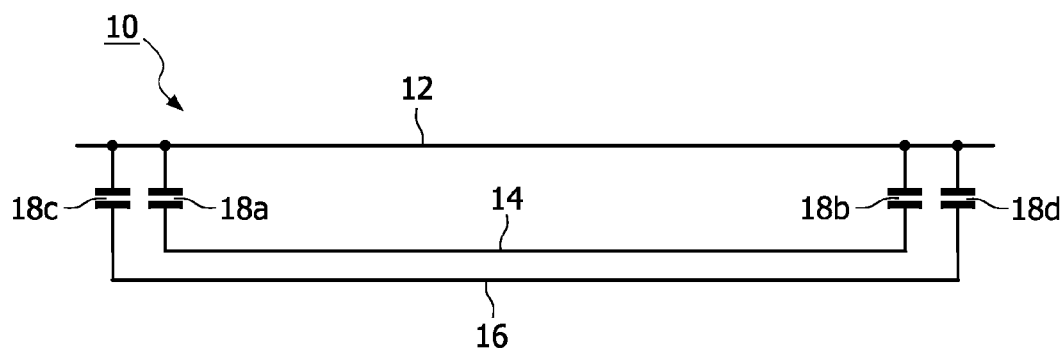
FIG. 9 illustrates another embodiment of the T/R coil array wherein transmit and receive coils are separately coupled to the shield to create an alternate current path.

FIG. 9 illustrates another embodiment of the T/R coil array 10 wherein transmit and receive coils are separately coupled to the shield 12 to create an alternate current path. The transmit coil 14 is coupled to the shield by capacitors 18a and 18b, while the receive coil 16 is coupled to the shield by capacitors 18c and 18d. In this manner, the transmit and receive coils are resonant and individually coupled to the shield at different distances to permit separate tuning to optimize SAR in the transmit coil and SNR in the receive coil.

Figure 10:
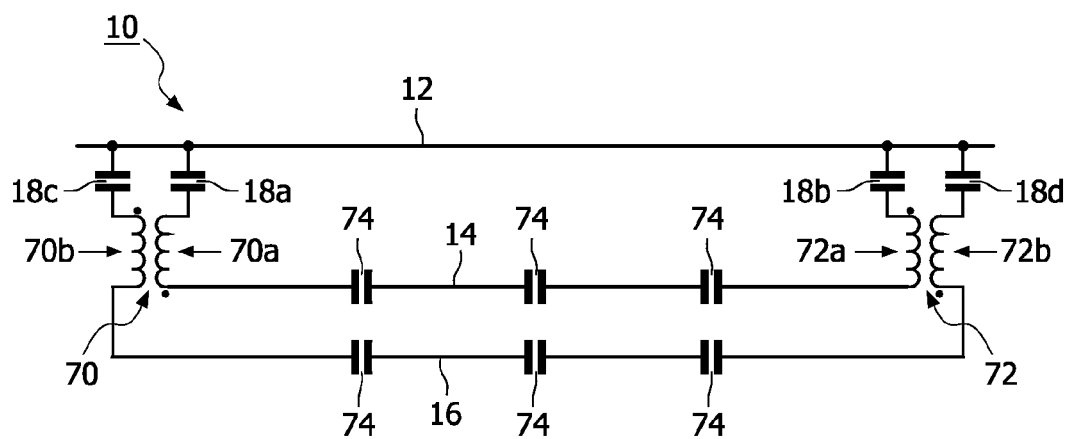
FIG. 10 illustrates an embodiment of the coil array in which the transmit and receive strips are mutually decoupled using inductive transformers.

FIG. 10 illustrates an embodiment of the coil array 10 in which the transmit and receive strips are mutually decoupled using inductive transformers. The coil array includes the transmit coil strip 14, which is coupled to a first side 70a of a first transformer 70 and a first side 72a of a second transformer 72. The first side of the first transformer is coupled to capacitor 18a, and the first side of the second transformer is coupled to capacitor 18b. The capacitors 18a and 18b are also coupled to the shield 12.

The receive strip 16 is coupled to a second side 70b of the first transformer 70 and to a second side 72b of the second transformer 72. The second side of the first transformer is coupled to capacitor 18c, and the second side of the second transformer is coupled to capacitor 18d. The capacitors 18c and 18d are also coupled to the shield 12. Additionally, the transmit and receive strips comprise a plurality of capacitors 74 that provide resonance.

It will be appreciated that although the transformers 70, 72 are illustrated using the dot convention to show current flow through the transmit and receive strips, the transformers may be arranged in other orientations and are not limited to the particular orientation shown in FIG. 10.

Figure 11:
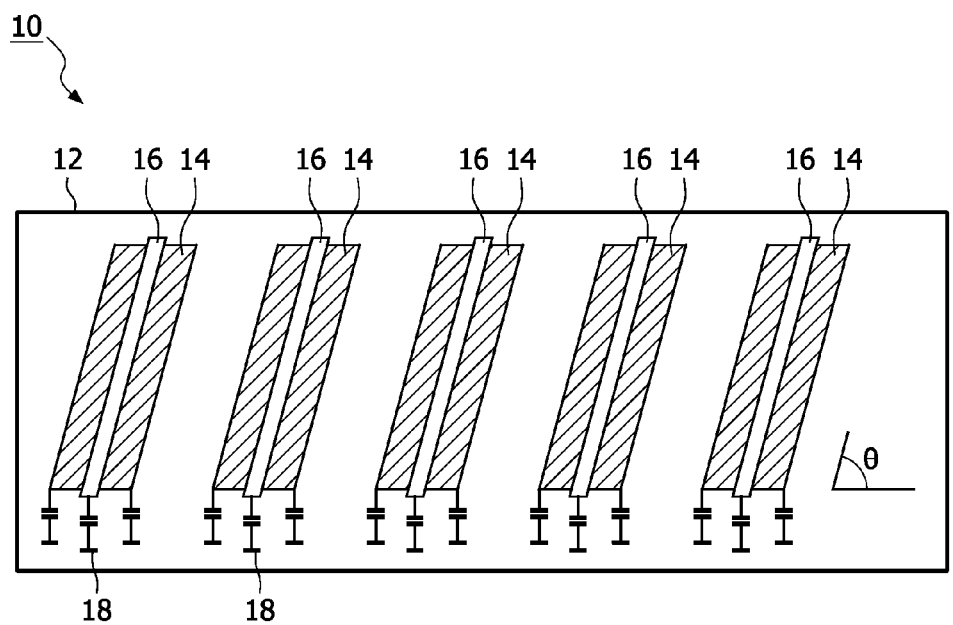
FIG. 11 illustrates a perspective view of an embodiment of the coil array wherein the transmit and receive strips have different widths.

FIG. 11 illustrates a perspective view of an embodiment of the coil array 10 wherein the transmit and receive strips have different widths. In one embodiment, the transmit strips 14 are wider than the receive strips 16. Transmit and receive strips are coupled to the shield 12 via a plurality of capacitors 18.

In another embodiment, one or both of the transmit and receive elements are loops positioned in a parallel orientation to relative to the shield. For instance, a transmit coil loop can be positioned parallel to the shield at a first distance therefrom, and a receive coil loop can be positioned parallel to the shield at a second distance that is greater than the first distance. Any coupling that occurs between the transmit and receive coils can be resolved using any of the techniques described herein and/or known decoupling techniques.

Figure 12:
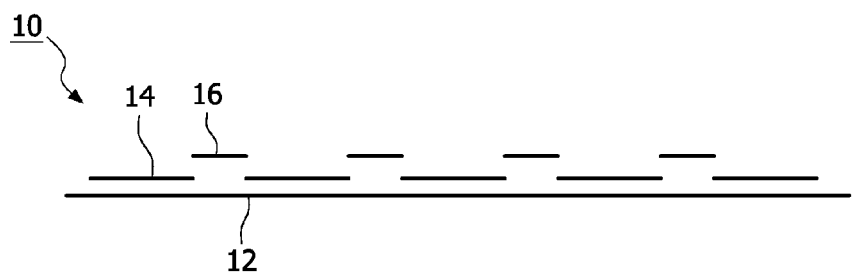
FIG. 12 shows another embodiment of the coil array that facilitates decoupling the transmit strips and the receive strips.

FIG. 12 shows another embodiment of the coil array 10 that facilitates decoupling the transmit strips and the receive strips. In this embodiment, the transmit strips 14 are spaced apart adjacent the shield 12, at a first distance, and the receive strips 16 are positioned in the spaces between the transmit strips at a second distance from the shield that is greater than the first distance. The receive strips are narrower than the transmit strips, which are close to the shield to reduce coupling. In another embodiment, coupling between the receive and transmit strips is resolved using known techniques.

Figure 13:
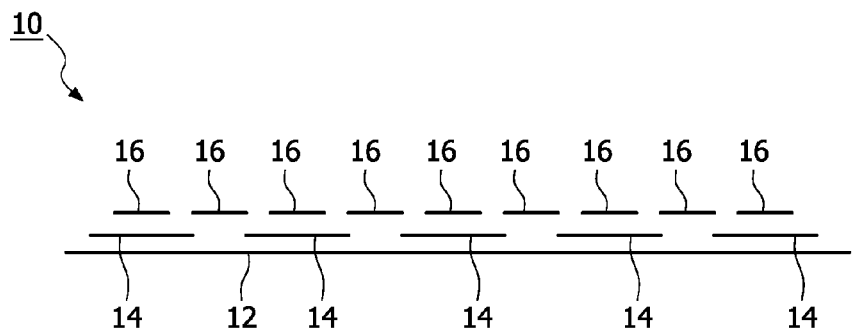
FIG. 13 illustrates another embodiment of the coil array in which a 2:1 ratio of receive coil strips to transmit coil strips is employed.

FIG. 13 illustrates another embodiment of the coil array 10 in which a 2:1 ratio of receive coil strips to transmit coil strips is employed. A plurality of receive strips 16 are positioned approximately centrally behind respective transmit strips 14 relative to the shield 12. Additionally, the plurality of receive strips are aligned with spaces between the transmit strips. The increased number (ratio) of receive strips to transmit strips can be employed to increase receive frequency and/or channels. In one embodiment, some of the receive strips are tuned to the proton frequency while other receive strips are tuned to detect a fluorine tracer or the like as it traverses a patient's vascular system.

Figure 14:
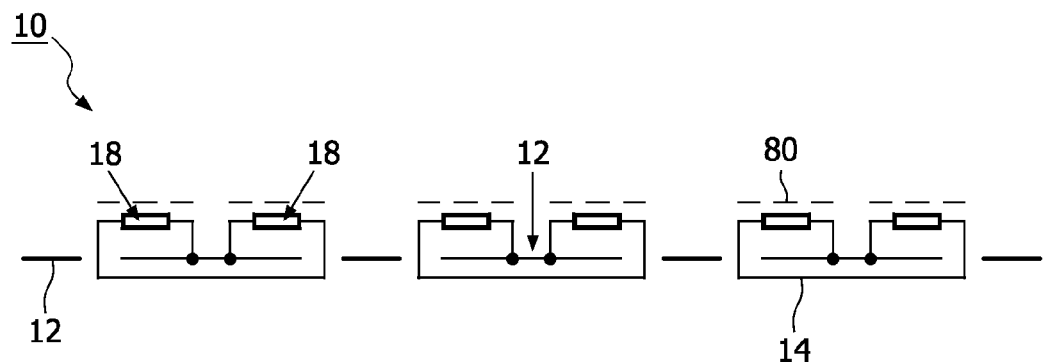
FIG. 14 illustrates an embodiment of the coil array for reducing local SAR in the transmit strip.

FIG. 14 illustrates an embodiment of the coil array 10 for reducing local SAR in the transmit strip 14. Part of the transmit strip 14 is placed in front of the shield 12, and the remainder of the strip and the capacitors 18 are placed behind the shield. Additionally, local shields 80 are positioned near the capacitors to reduce coupling between the transmitter strip 14 and a receiver strip (not shown) and to other system components. The capacitors provide resonance to the transmit strip, and are mounted behind the shield 12 to reduce SAR.

Figure 15:
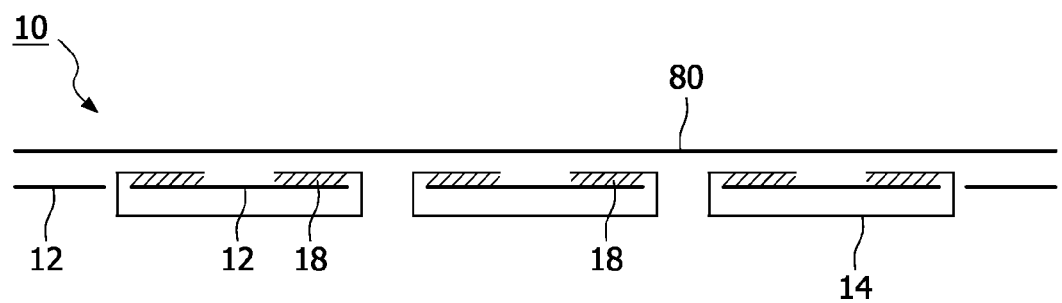
FIG. 15 illustrates an embodiment of the coil array in which thin multi-layered capacitors are employed.

FIG. 15 illustrates an embodiment of the coil array 10 in which thin multi-layered capacitors are employed. The transmit strip 14 is positioned partially in front of the shield 12 and partially behind it. Capacitors 18 connect the transmit strip to the shield on a rearward portion of the shield (e.g., on a side opposite to a patient). A second shield 80 is provided that protects other components (not shown) from inductance caused by the capacitors 18. In one embodiment, the capacitors are formed of Teflon or the like.

Figure 16:
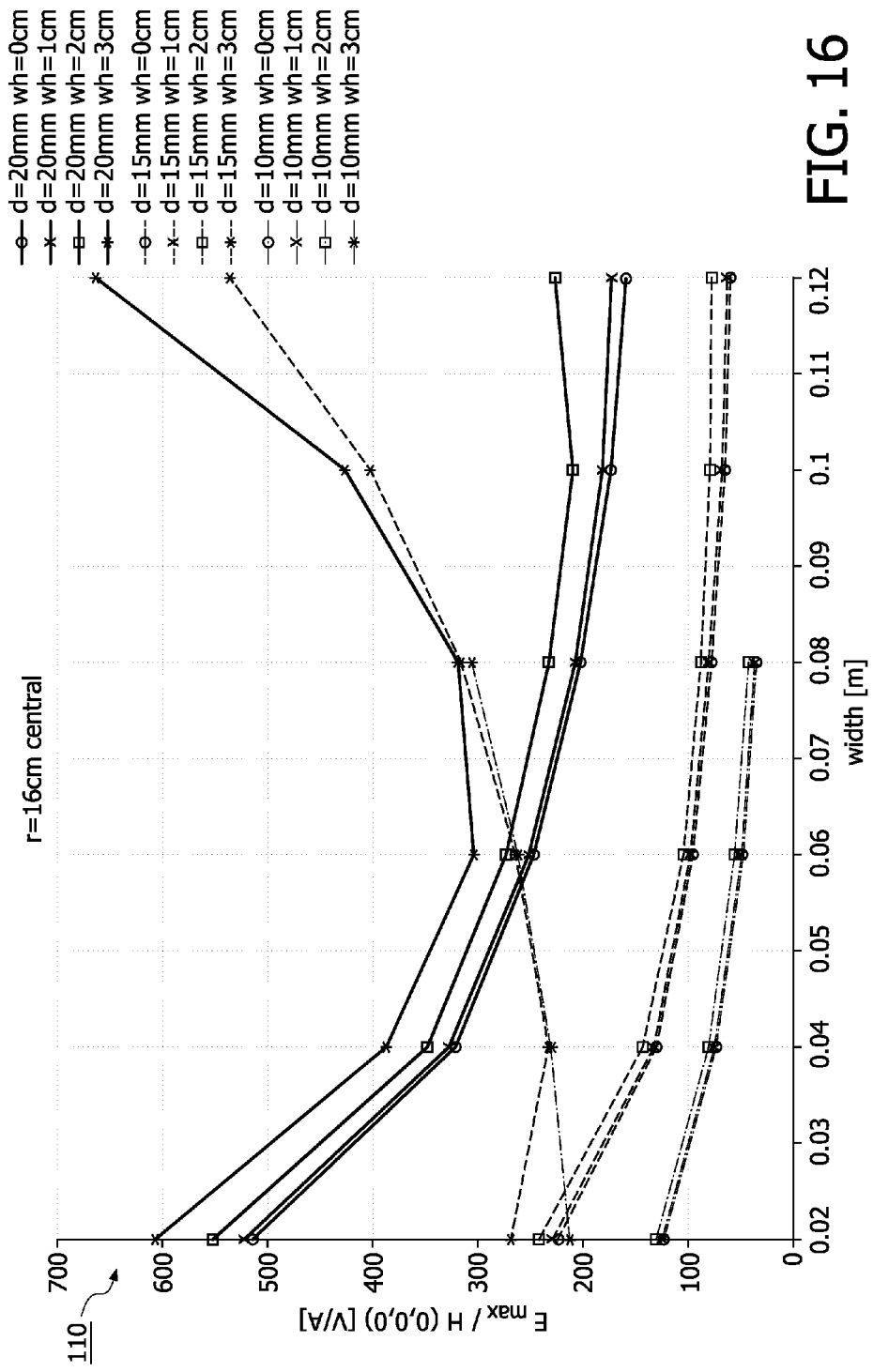
FIG. 16 illustrates a graph showing a relationship between local electrical field strength and distance to the RF shield.

FIG. 16 illustrates a graph 110 showing a relationship between local electrical field strength and distance to the RF shield. As a transmit strip is moved closer to the RF shield, local electrical field strength is reduced. For example, the electrical field to magnetic field ratio (E/H) is reduced by a factor of 3 to 4 when the distance between the transmit strip and the RF shield is reduced by approximately 50%.

Figure 17:
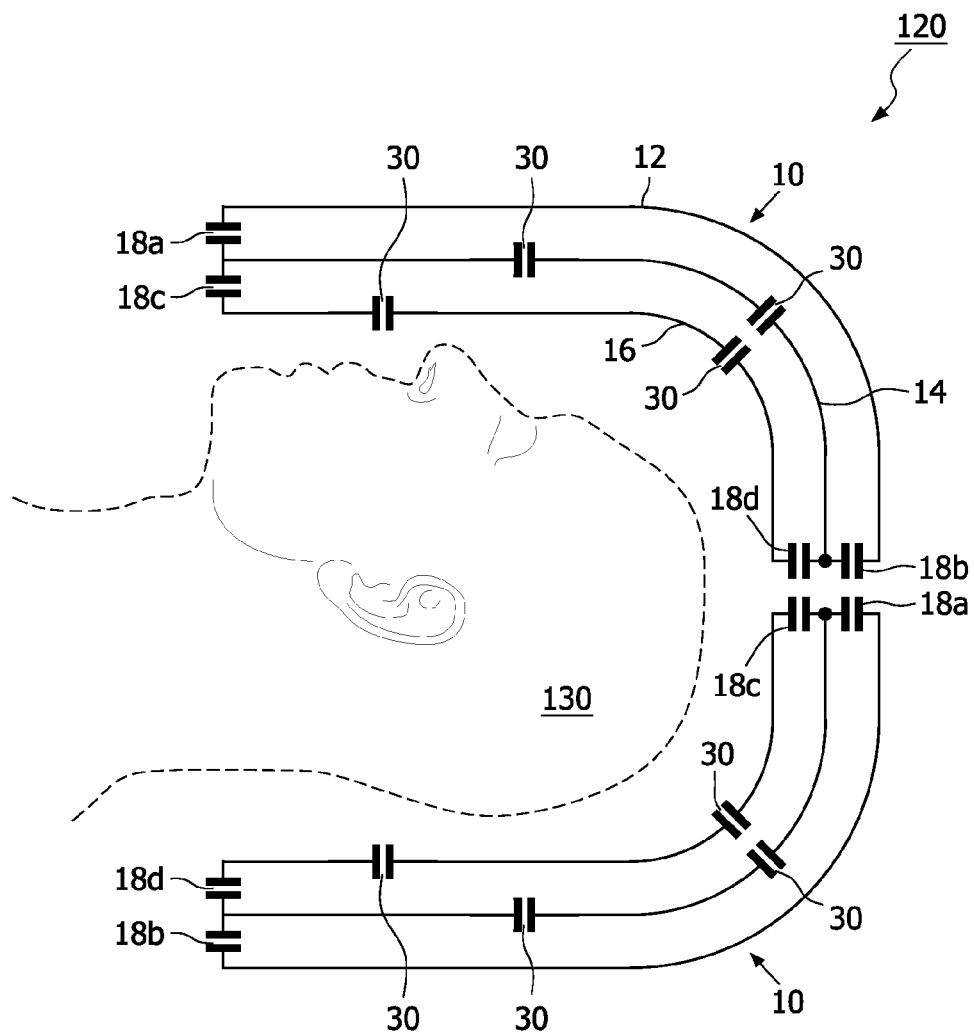
FIG. 17 illustrates an imaging cage structure comprising a plurality of coil arrays employed to perform a head scan on a patient.

FIG. 17 illustrates an imaging cage structure 120 comprising a plurality of coil arrays 10 employed to perform a head scan on a patient 130. For example, multiple coil arrays can be coupled together to form a cage-like structure that fits over the head of the patient. Each array includes the shield 12 coupled to respective transmit strip(s) 14 and receive strip(s) 16 by capacitors 18*a-d*. The receive strip(s) and transmit strip(s) additionally comprise a plurality of capacitors 30 that provide resonance to the respective circuits. It will be appreciated that, although the transmit and receive strips are coupled to the shield in a configuration similar to that of FIG. 2, the array may be configured according to any of the preceding figures and related description.

Figure 18:
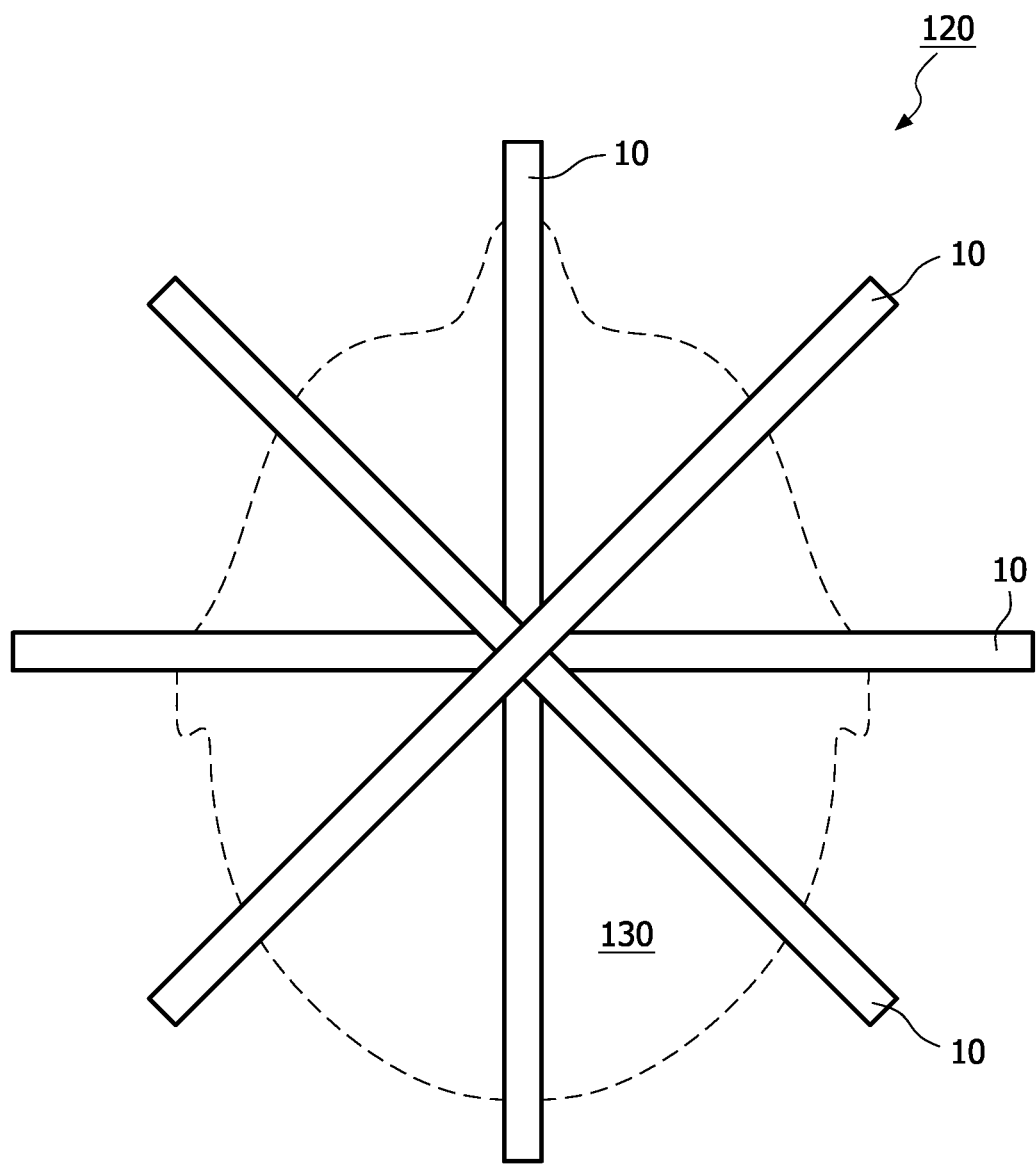
FIG. 18 illustrates a top-down view of the imaging cage structure of FIG. 17, arranged for imaging a portion of a patient.

FIG. 18 illustrates a top-down view of the imaging cage structure 120 arranged for imaging a portion of a patient. The cage includes a plurality of coil arrays 10 positioned to substantially surround the portion of the patient 130 to ensure complete data acquisition during an imaging procedure or scan. Although the cage 120 is depicted as surrounding a patient's head, it will be understood that the flat and/or flexible coil arrays described herein may be employed to generate any desired shape and/or size cage for imaging any desired portion of the patient, up to and including the entire patient.

The innovation has been described with reference to several embodiments. Modifications and alterations may occur to others upon reading and understanding the preceding detailed description. It is intended that the innovation be construed as including all such modifications and alterations insofar as they come within the scope of the appended claims or the equivalents thereof.

The invention claimed is:

1. A double-layer transmit and receive (T/R) coil array for a high field magnetic resonance imaging (MRI) system for imaging an object, the system including:
   a radio frequency (RF) shield;
   a transmit coil strip, positioned adjacent the shield at a first distance from the shield closer to the object then the shield; and
   a receive coil strip that receives MR data positioned closer to the object then the transmit coil strip at a second distance from the shield, the second distance being greater than the first distance.

2. The coil array according to claim 1, wherein the transmit coil strip is wider than the receive coil strip.

3. The coil array according to claim 1, wherein the transmit coil strip and the receive coil strip are each capacitively connected to the shield.

4. The coil array according to claim 3, wherein the transmit coil strip is connected to the shield at each end by capacitors, and the receive coil strip is connected at each end to capacitors, which are also connected to the capacitors respectively.

5. The coil array according to claim 1, further including first and second transformers that mutually decouple the transmit coil strip and the receive coil strip.

6. The coil array according to claim 5, wherein the transmit coil strip is coupled to a first side of the first transformer and a first side of the second transformer, and wherein the receive coil strip is coupled to a second side of the first transformer and to a second side of the second transformer.

7. The coil array according to claim 1, wherein the transmit coil strip and the receive coil strip each include a pin diode.

8. The coil array according to claim 1, wherein the transmit coil strip and the receive coil strip provide double resonance to the coil array.

9. The coil array according to claim 1, further including an RF feed line having capacitors, wherein the RF feed line passes between the shield and transmit coil strip and connects to a second shield.

10. The coil array according to claim 1, including a plurality of transmit strips and a plurality of receive strips.

11. A magnetic resonance scanner including a plurality of the transmit strips and a plurality of the receive strips of claim 1.

12. The coil array according to claim 1, wherein the coil array is one of a plurality of coil arrays configured to form a coil assembly.

13. The coil array according to claim 1, wherein the first distance is varied along the length of the RF shield to generate a B1 field gradient along the coil array.

14. A method for concurrently reducing specific energy absorption rate (SAR) and increasing signal-to-noise ratio (SNR) for transmit and receive elements in a T/R coil array in a high-field magnetic resonance imaging (MRI) system for imaging an object positioned within a region of interest (ROI), the method comprising acts of:
   positioning a transmit coil strip at a first distance from a radio frequency (RF) shield closer to the ROI then the RF shield;
   positioning a receive coil strip at a second distance from the RF shield closer to the ROI then the transmit coil strip, the second distance being greater than the first distance; and
   transmitting RF pulses with the transmit coil strip and receiving resonance signals with the receive coil strip.

15. The method according to claim 14, further comprising an act of varying the first distance along the length of the RF shield to generate a B1 field gradient along the coil array.

16. The method according to claim 11, wherein the act of transmitting the RF pulses comprises an act of one of turning off or detuning the receive coil strip when the RF pulses are transmitted.

17. The method according to claim 14, wherein the act of receiving the resonance signals comprises an act of one of turning off or detuning the transmit coil strip when the resonance signals are received.

18. The coil array according to claim 1, wherein the transmit coil strip is longer and extends past the receive coil strip.

* * * * *